(12) United States Patent
Zebedee et al.

(10) Patent No.: US 8,107,587 B2
(45) Date of Patent: Jan. 31, 2012

(54) DIGITAL LOGIC CIRCUIT, SHIFT REGISTER AND ACTIVE MATRIX DEVICE

(75) Inventors: Patrick Zebedee, Oxford (GB); Jaganath Rajendra, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/736,488

(22) PCT Filed: Mar. 27, 2009

(86) PCT No.: PCT/JP2009/056919
§ 371 (c)(1), (2), (4) Date: Oct. 13, 2010

(87) PCT Pub. No.: WO2009/133749
PCT Pub. Date: Nov. 5, 2009

(65) Prior Publication Data
US 2011/0033022 A1    Feb. 10, 2011

(30) Foreign Application Priority Data

Apr. 29, 2008  (GB) .................................. 0807751.3

(51) Int. Cl.
*G11C 19/00* (2006.01)
(52) U.S. Cl. ................ 377/64; 377/74; 377/79; 327/217
(58) Field of Classification Search .................. None
See application file for complete search history.

(56) References Cited

U.S. PATENT DOCUMENTS

| | | | |
|---|---|---|---|
| 4,412,139 A | 10/1983 | Horninger | |
| 5,051,610 A | 9/1991 | Terane et al. | |
| 5,222,082 A | 6/1993 | Plus | |
| 5,410,583 A | 4/1995 | Weisbrod et al. | |
| 5,434,899 A | 7/1995 | Huq et al. | |
| 5,701,136 A | 12/1997 | Huq et al. | |
| 5,949,398 A | 9/1999 | Kim | |
| 6,166,571 A * | 12/2000 | Wang | 327/115 |
| 6,377,099 B1 | 4/2002 | Cairns et al. | |

(Continued)

FOREIGN PATENT DOCUMENTS

GB    2 452 278    3/2009

(Continued)

OTHER PUBLICATIONS

International Search Report.

(Continued)

*Primary Examiner* — Tuan T Lam
(74) *Attorney, Agent, or Firm* — Harness, Dickey & Pierce, P.L.C.

(57) ABSTRACT

A digital logic circuit includes a plurality of transistors of a same conduction type. In at least one embodiment, a first transistor has a source, gate and drain connected to a first circuit node, a second circuit node and a first power supply line, respectively. A second transistor has a source, gate and drain connected to the second node, the first node and the first supply line, respectively. A third transistor has a drain connected to the first node. A fourth transistor has a gate and drain connected to a third circuit node and the second circuit node, respectively. A fifth transistor has a gate and drain connected to the first and third nodes, respectively. Such a circuit may be used, for example, as a latch in a shift register of an active matrix addressing arrangement.

39 Claims, 14 Drawing Sheets

U.S. PATENT DOCUMENTS

| | | | |
|---|---|---|---|
| 6,657,472 B1 * | 12/2003 | Raza et al. | 327/217 |
| 6,690,347 B2 | 2/2004 | Jeon et al. | |
| 6,724,361 B1 | 4/2004 | Washio et al. | |
| 6,777,988 B2 * | 8/2004 | Tung et al. | 327/115 |
| 6,778,627 B2 | 8/2004 | Yu | |
| 6,813,332 B2 | 11/2004 | Nagao et al. | |
| 6,831,489 B2 * | 12/2004 | Cheung et al. | 327/115 |
| 6,845,140 B2 | 1/2005 | Moon et al. | |
| 6,922,217 B2 | 7/2005 | Kim | |
| 6,928,135 B2 | 8/2005 | Sasaki et al. | |
| 7,038,653 B2 | 5/2006 | Moon | |
| 7,236,029 B2 * | 6/2007 | Gossmann | 327/202 |
| 2004/0257111 A1 | 12/2004 | Tobita | |
| 2007/0091014 A1 | 4/2007 | Yamashita et al. | |
| 2008/0123799 A1 | 5/2008 | Otose | |

FOREIGN PATENT DOCUMENTS

| | | |
|---|---|---|
| GB | 2 452 279 | 3/2009 |
| JP | 02-290320 | 11/1990 |
| JP | 04-352511 | 12/1992 |

OTHER PUBLICATIONS

British Search Report for GB 0807751.3.

* cited by examiner

PRIOR ART
F I G. 4
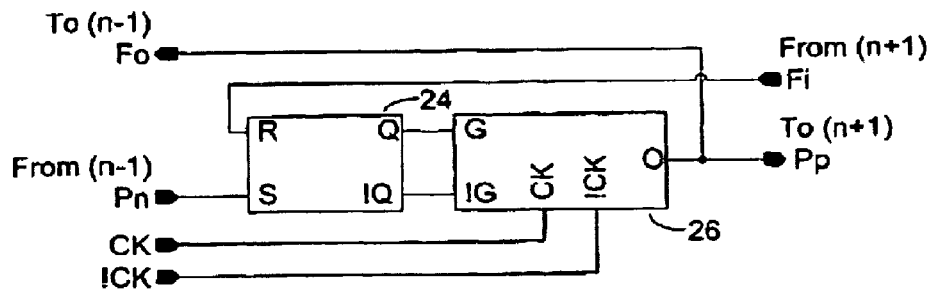
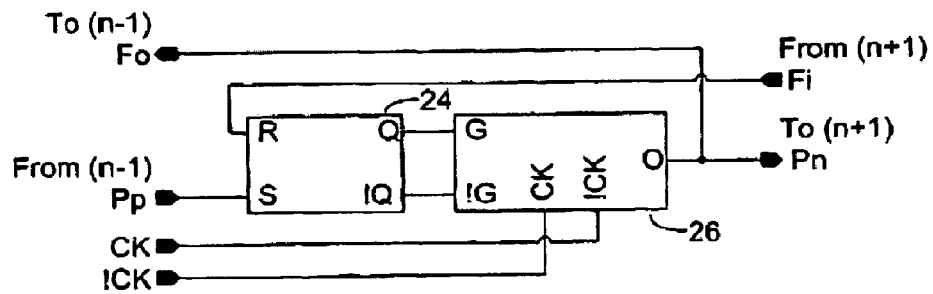
PRIOR ART
F I G. 5
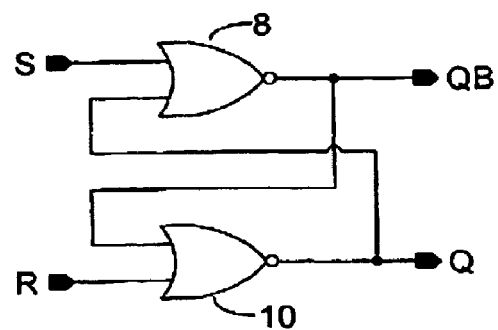

F I G. 1 8
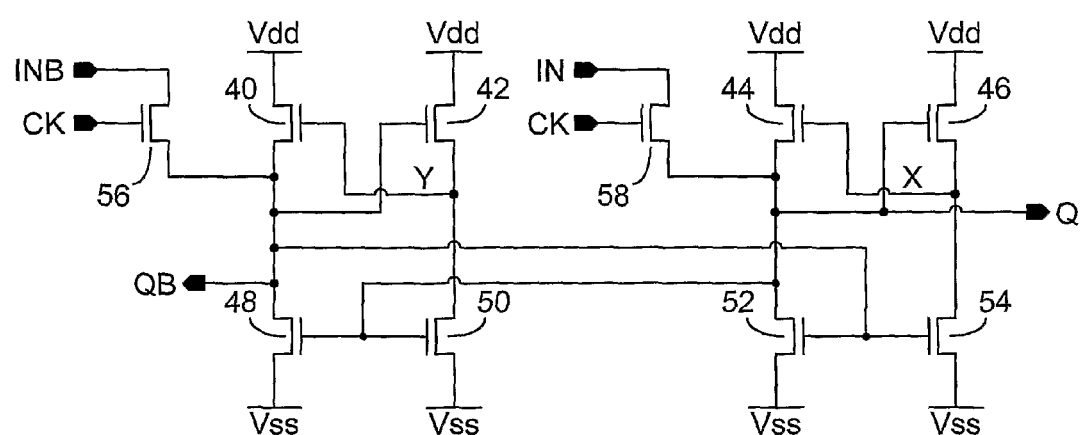

F I G. 2 0
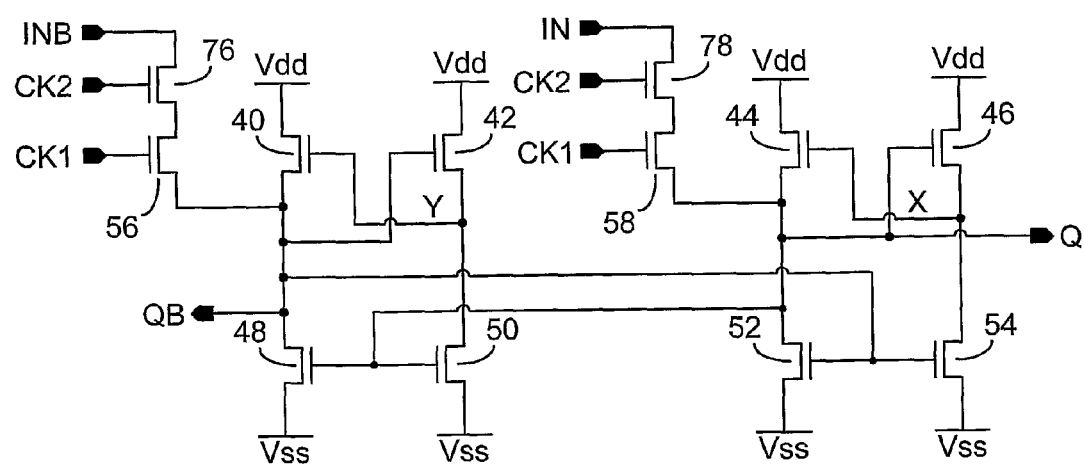

DIGITAL LOGIC CIRCUIT, SHIFT REGISTER AND ACTIVE MATRIX DEVICE

TECHNICAL FIELD

The present invention relates to a digital logic circuit and to a shift register and an active matrix device including such a circuit. Such a circuit may be used, for example, as a flip-flop, suitable for use in a clock generator to drive the rows and/or columns of an active-matrix display.

BACKGROUND ART

FIG. 1 of the accompanying drawings shows a typical active matrix display. Such a display is made up of a matrix 2 of picture elements (pixels), arranged in M rows and N columns. Each row and column is connected to an electrode, with the column electrodes being connected to the N outputs of a data driver 4 and the row electrodes being connected to the M outputs of a scan driver 6.

The pixels are addressed one row at a time. The scan driver includes an M-phase clock generator, which produces a series of clock pulses as shown in FIG. 2 of the accompanying drawings. Each clock pulse $OUT_i$ controls the activation of row i for each i such that $1 \leq i \leq M$. It is usual for the pulses to be non-overlapping, such that no two pulses are high at the same time.

All the pixels of one row may be addressed simultaneously, or they may be addressed in B blocks of b pixels, where bB=N. In the latter case, the data driver may also include a B-phase clock generator of the type described, such that each clock pulse $OUT_i$ activates block i for each Ii such that $1 \leq i \leq B$.

Normal operation of the display is such that data is sampled onto the pixels from top to bottom and from left to right, corresponding to the timing shown in FIG. 2. However, it is a common requirement for the direction of sampling to be switchable, such that data is sampled onto the pixels from bottom to top and/or from right to left. In this way, it is possible to reflect or rotate the image displayed without re-ordering the input data. Such re-ordering requires considerable additional circuitry, such as additional memory sufficient to store the whole image.

In this case, the clock generators must in addition be able to operate bi-directionally, producing either clock pulses as in FIG. 2, or clock pulses of the type shown in FIG. 3 of the accompanying drawings. Each pulse $OUT_i$ in FIG. 3 (for each i such that $1 \leq i \leq M$) still activates row i. However, pulse $OUT_i$ occurs before pulse $OUT_{i-1}$, whereas in FIG. 2 pulse $OUT_i$ occurred after pulse $OUT_{i-1}$.

Scan drivers of the type described may be formed directly on the display substrate, reducing the number of connections required to the display. This is advantageous, since it reduces the area occupied by the connector, and leads to a display which is more mechanically robust. In such cases, it is common to use a single type of transistor for the clock generator circuit. For example, the circuit may be composed of only n-type transistors, rather than a mixture of n- and p-type transistors, as commonly used in CMOS circuits. The use of a single type of transistor is advantageous for manufacturing cost. However, it is difficult to design low-power, high-speed logic, such as AND gates and inverters, using a single type of transistor.

A clock generator for use in a scan driver may be formed from a shift register. A shift register is a multi-stage circuit capable of sequentially shifting a sequence of data from stage to stage along its length in response to a clock signal. In general, a shift register may shift an arbitrary sequence of data. However, when a shift register is used as a clock generator in a scan or data driver, it is only required to shift a single high state along its length. Such a shift register is referred to as a "walking one" shift register, and may or may not be capable of shifting an arbitrary sequence of data.

An example of such a type of clock generator is disclosed in U.S. Pat. No. 6,377,099, and is shown in FIG. 4 of the accompanying drawings. Each stage is composed of a reset-set (RS) latch 24, with an additional gate 26 to control the passage of the clock, such that the clock is passed to the output of the stage when the RS latch is set, and the output is pulled to an inactive state when the RS latch is reset. The output of the gate is connected to the set input of the next stage, and to the reset input of the previous stage. The output of the gate also forms an output of the scan driver.

In addition, U.S. Pat. No. 6,724,361 describes a similar clock generator which uses non-overlapping clocks.

A RS latch is a well-known logic block. As shown in FIG. 4, it has a set input, S, and a reset input, R, and two outputs Q and QB, where QB is the logical complement of Q. It operates according to the following truth table 1:

TABLE 1

| R | S | $Q_n$ |
|---|---|---|
| 0 | 0 | $Q_{n-1}$ |
| 0 | 1 | 1 |
| 1 | 0 | 0 |
| 1 | 1 | X | where 0 and 1 are the low and high logic levels respectively, X is an undefined or disallowed state, $Q_n$ is the current output state, and $Q_{n-1}$ is the previous output state.

A typical implementation of a RS latch is shown in FIG. 5 of the accompanying drawings, and is composed of two cross-coupled NOR gates, 8 and 10. When the set input, S, is raised to a logic high state, the output of NOR gate 8 falls to a low state, irrespective of the state of its other input. If the reset input, R, is at a low level (as required by the truth table), the output of NOR gate 10 rises to a high level. Thus Q and QB attain the required states.

When the set input is subsequently lowered to a logic low state, and while the reset input remains in a logic low state, the high state on Q causes NOR gate 8 to output a low state, which in turn causes NOR gate 10 to output a high state. The Q and QB inputs therefore retain their previous values.

This state illustrates the bi-stable nature of the flip-flop: there is a positive feedback loop from the Q output, via NOR gate 8, the QB output, and NOR gate 10, back to the Q output. If the Q output is affected by noise, its value will be restored by NOR gate 10 and the state of QB; similarly, QB is held by NOR gate 8 and the state of Q. The state of the flip-flop's outputs is therefore immune to the effects of noise (at least within reasonable limits).

FIG. 6 of the accompanying drawings shows the simplest implementation of a RS latch in a single-channel process, and is similar in operation to circuits described in U.S. Pat. Nos. 6,778,627, 5,434,899 and 5,949,398. Two transistors, 12 and 14, connect the Q output to a high- or low-level supply when the S or R inputs are high respectively. When S and R are both low, both transistors are off, and the state of the flip-flop is preserved by the trapped charge on the capacitance of the Q node. This capacitance may be explicit or parasitic. An additional circuit is needed to generate a QB output: this would be as in FIG. 6 of the accompanying drawings, but with the S and R inputs reversed.

Transistor 12 may also be diode-connected, such that the connection to Vdd is replaced by an additional connection to the S input, without affecting the operation described above.

A major disadvantage of this architecture is that there is no positive feedback, and the Q node is floating. Thus any noise in the system can easily be coupled onto the node, and its state may be corrupted. The state will not be restored unless either the R or S input is raised to a high level.

An additional disadvantage is that the Q node is not fully charged to Vdd in the set state. An n-channel transistor conducts when its gate is higher than the source by at least the threshold voltage of the transistor, $V_{TH}$. Therefore, if the S input is raised to Vdd, transistor 12 will only conduct until Q reaches (Vdd–$V_{TH}$). In many applications, it is desirable for the level of the Q and QB outputs to swing from the high to the low voltage supply rails.

FIG. 7 of the accompanying drawings shows a second implementation of a RS latch in a single-channel process, and is similar in operation to circuits described in U.S. Pat. Nos. 7,038,653, 6,922,217, 6,845,140.

To effect a reset operation, the R input is raised to a high level, discharging the Q output through transistor 20, and turning off transistor 25. Transistor 18 is diode-connected, so conducts if its source is at least one threshold drop below the high voltage supply, Vdd. QB is therefore raised to a high level by transistor 18, turning on transistor 22. Thus, when the R input is subsequently lowered to a low state, transistor 22 maintains the low state on Q, and transistor 18 maintains the high state on QB. The circuit therefore shows good noise immunity in the reset state.

To effect a set operation, the S input is raised to a high level, charging the Q output to a high level through transistor 16. This turns on transistor 25, discharging the QB output, which in turn turns off transistor 22. However, when the S input is subsequently lowered to a low state, transistors 16, and 22 are all off, and the Q node floats. The circuit therefore has poor noise immunity in the set state. In addition, Q is not fully charged to Vdd, for reasons described previously.

A further disadvantage of the circuit of FIG. 7 of the accompanying drawings is that, in the set state, transistors 18 and 25 are both on, and a short-circuit current flows from the high to the low power supply. In a low-frequency circuit, such as the scan driver for an active matrix display, this short-circuit current can be significant, perhaps increasing the power consumption of the circuit by a factor of 2 to 4.

Other approaches to this circuit, such as described in U.S. Pat. Nos. 6,690,347, 5,701,136, 5,410,583, 5,222,082, 6,813, 332 and 6,928,135, all exhibit at least one of the two disadvantages described: there is a floating node or a short-circuit current in at least one state of the latch.

U.S. Pat. No. 7,038,653 also describes a single-channel output switch for a shift register stage, and illustrates the use of a bootstrap capacitor, as shown in FIG. 8 of the accompanying drawings. The Q and QB inputs are connected to the Q and QB outputs of a latch respectively, and the CK input is connected to a shift register clock. The Q output may not reach the high supply rail, and therefore not fully conduct the voltage of the clock to the OUT pin. The bootstrap capacitor, 61, acts to increase the gate voltage of transistor 27 when CK rises. Its operation is as follows: the gate of transistor 27 is raised by the logic to a point where it conducts; when the clock rises, the rise is conducted to the output; this rise is coupled to the gate of transistor 27 by the capacitor 61, increasing the gate voltage, and ensuring that transistor 27 continues to conduct until its source and drain voltages are substantially equal. Transistor 29 holds the output at the low supply voltage, Vss, when the QB input is high: no bootstrap is necessary, since an n-channel transistor will conduct Vss as long as its gate is held at least (Vss+$V_{TH}$): QB is typically at a higher voltage.

A second type of latch is the D latch. A well-known type of such a latch is shown in FIG. 9 of the accompanying drawings. When CK is high, the input, D, is copied to the output Q, and its logical complement to the complementary output QB. When the clock falls, the state of Q is held. A positive feedback loop is formed by the switch 31, and the value of D is latched.

US patent application publication number 2007/0091014 describes a single-channel shift register made from a cascade of D latches. FIG. 10 of the accompanying drawings shows the latch circuit described. When CK is high (and its complement, CKX is low) the latch is transparent, and the output OUT follows the input IN. When CK is low, the input data is latched and held on the output.

The circuit has similar disadvantages to those previously described: transistors 28 and 30 are always on, and one of transistors 32 and 34 is on for any data. Therefore a short-circuit current flows from Vcc 1 to the low supply rail Vss, increasing the power consumed by the circuit. In addition, the output voltage is lower than Vcc1, except in the case where Vcc2 is at least equal to (Vcc1+$V_{TH}$). However, generating a higher-voltage Vcc2 increases both the power consumption of the circuit and the complexity of a reference-generation circuit.

DISCLOSURE OF INVENTION

According to a first aspect of the invention, there is provided a digital logic circuit comprising a plurality of transistors of a same conduction type, the plurality of transistors comprising: a first transistor whose source, gate and drain are connected to a first circuit node, a second circuit node and a first power supply line, respectively; a second transistor whose source, gate and drain are connected to the second node, the first node and the first supply line, respectively; a third transistor whose drain is connected to the first node; a fourth transistor whose gate and drain are connected to a third circuit node and the second node, respectively; and a fifth transistor whose gate is connected to the first or second node and whose drain is connected to the third node.

The gate of the third transistor may be connected to the third node.

The circuit may comprise a first bootstrap capacitor connected between the first and second nodes.

One of the first and second nodes may comprise a first output of the circuit.

The first node may comprise a first input node of the circuit.

The plurality of transistors may comprise a sixth transistor whose source and gate are connected to the first node and a first input of the circuit, respectively.

The sources of the third and fourth transistors may be connected to the first input.

The sources of the third and fourth transistors may be connected to a second input of the circuit.

The sources of the third and fourth transistors may be connected to a second power supply line.

The drain of the sixth transistor may be connected to the first supply line.

The drain of the sixth transistor may be connected to the first input.

The drain of the sixth transistor may be connected to a third input of the circuit.

The plurality of transistors may comprise a seventh transistor whose source and gate are connected to the drain of the sixth transistor and a fourth input of the circuit respectively.

The plurality of transistors may comprise an eighth transistor whose source and gate are connected to the first node and a fifth input of the circuit, respectively.

The fifth input may comprise a global reset input.

The plurality of transistors may comprise a ninth transistor whose gate and drain are connected to the first input and the third node, respectively.

The plurality of transistors may comprise a tenth transistor whose source, gate and drain are connected to the third node, a sixth input of the circuit and the first supply line, respectively.

The plurality of transistors may comprise: an eleventh transistor whose source, gate and drain are connected to the third node, a fourth circuit node and the first supply line, respectively; a twelfth transistor whose source, gate and drain are connected to the fourth node, the third node, and the first supply line, respectively; and a thirteenth transistors whose drain is connected to the fourth node.

The gate of the thirteenth transistor may be connected to the first or second node.

The circuit may comprise a second bootstrap capacitor connected between the third and fourth nodes.

One of the third and fourth nodes may comprise a second output of the circuit.

The third node may comprise a second input node of the circuit.

The plurality of transistors may comprise a fourteenth transistor whose source and gate are connected to the third node and a seventh input of the circuit, respectively.

The sources of the fifth and thirteenth transistors may be connected to the seventh input.

The sources of the fifth and thirteenth transistors may be connected to a or the second power supply line.

The sources of the fifth and thirteenth transistors may be connected to an eighth input of the circuit.

The drain of the fourteenth transistor may be connected to the first supply line.

The drain of the fourteenth transistor may be connected to the seventh input.

The drain of the fourteenth transistor may be connected to a ninth input of the circuit.

The plurality of transistors may comprise a fifteenth transistor whose source and gate are connected to the drain of the fourteenth transistor and a tenth input of the circuit, respectively.

The plurality of transistors may comprise a sixteenth transistor whose source and gate are connected to the third node and an eleventh input of the circuit, respectively.

The plurality of transistors may comprise a seventeenth transistor whose gate and drain are connected to the sixth input and the first node, respectively.

The circuit may comprise a latch or flip flop.

According to a second aspect of the invention, there is provided a shift register comprising a plurality of latches or flip flops comprising circuits according to the first aspect of the invention.

According to a third aspect of the invention, there is provided an active matrix device comprising a register according to the second aspect of the invention.

The device may comprise a liquid crystal device.

It is thus possible to provide a versatile digital logic circuit which may be used with advantage in various applications. For example, when used or configured as a latch or flip-flop in a shift register, the circuit is capable of providing improved noise immunity because of positive feedback. Also, short-circuit currents between supply lines may be substantially avoided, resulting in reduced power consumption with power being consumed substantially only during switching. This may be achieved with transistors of a single conduction type. For example, all of the transistors may be either p-channel MOS transistors or n-channel MOS transistors.

BRIEF DESCRIPTION OF DRAWINGS

FIG. 4 shows a prior art shift register, suitable for use in a scan driver;

FIGS. 5, 6 and 7 are schematic diagrams of prior art CMOS reset-set flip-flops;

FIG. 18 is a schematic diagram of a latch circuit according to an eighth embodiment of the invention;

FIG. 20 is a schematic diagram of a latch circuit according to a tenth embodiment of the invention;

BEST MODE FOR CARRYING OUT THE INVENTION

Figure 11:
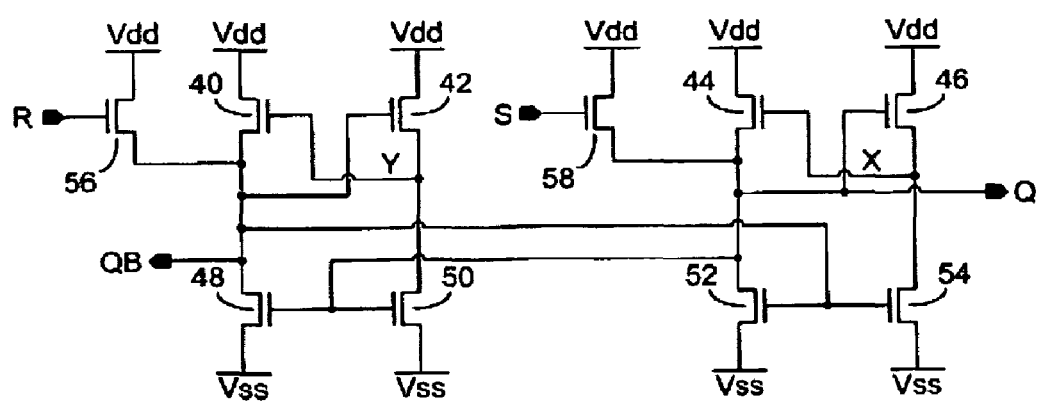
FIG. 11 is a schematic diagram of a latch circuit according to a first embodiment of the invention.

The first, preferred embodiment is shown in FIG. 11. It is composed of n-channel transistors 40 to 58: the drains of transistors 40-46, 56 and 58 are connected to the high power supply, Vdd; the sources of transistors 48-54 are connected to the low power supply, Vss; the sources of transistors 40 and 56 are connected together, to the gates of transistor 42, 52 and 54, to the drain of transistor 48, and to the QB output at a node which constitutes a first input node; the source of transistor 42 is connected to the drain of transistor 50, and to the gate of transistor 40, labelled node Y; the sources of transistors 44 and 58 are connected together, and to the gates of transistors 46-50, and to the Q output at a node which constitutes a second input node; the source of transistor 46 is connected to the gate of transistor 44 and the drain of transistor 54, labelled node X; the gates of transistors 56 and 58 are connected to the R and S inputs respectively.

The circuit is configured as an RS latch: when the S input is raised to a high state, the Q output is charged high, switching on transistors 46-50; the QB output and the gate of transistor 40 are discharged by transistors 48 and 50, and transistors 40 and 42 are switched off; similarly, the low state on QB turns off transistors 52 and 54. Thus no steady-state current flows.

Q is charged to (Vdd–$V_{TH}$), which in turn charges node X to (Vdd–$2V_{TH}$). QB and node Y are both discharged to Vss.

When the S input subsequently falls, Q remains charged to (Vdd–$V_{TH}$), which maintains the voltage on node X. Similarly, if Q is affected by noise, and its voltage falls, it will be maintained at (Vdd–$3V_{TH}$) by node X. The circuit therefore exhibits improved noise immunity.

When the R input is raised to a high state, the operation of the latch is similar, with the roles of Q and QB, and of X and Y reversed.

It is also possible to use node X as an alternative Q output, and node Y as an alternative QB output: X is high when Q is high, although its voltage is lower, and low when Q is low. Y and QB are similarly related.

For the same reason, it is also possible to connect the gates of transistors 48 and 50 to either the Q output or node X. The gates of both transistors may be connected to the same node, or one may be connected to node X and the other to the Q output. Similarly, the gates of transistors 52 and 54 may be connected to either the QB output or node Y.

Figure 12:
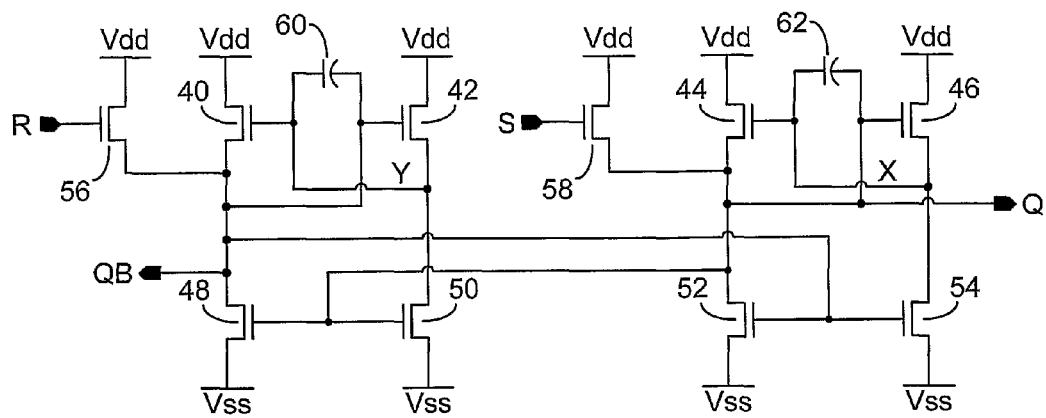
FIG. 12 is a schematic diagram of a latch circuit according to a second embodiment of the invention.

The second embodiment is shown in FIG. 12. The circuit is similar to FIG. 11, with the addition of bootstrap capacitors between node X and the Q output, and between node Y and the QB output.

These bootstrap capacitors operate as described in the prior art, and serve to increase the voltage on Q, QB, X and Y: when the S input is raised to a high state, Q is charged to (Vdd-$V_{TH}$); transistor 46 then charges node X; as the voltage on X increases, this rise is coupled to Q by capacitor 62, increasing the voltage on Q; X therefore rises to Vdd or ($V_Q$-$V_{TH}$), whichever is the lower, where $V_Q$ is the maximum voltage on Q. Capacitor 60 operates similarly, bootstrapping QB.

Figure 13:
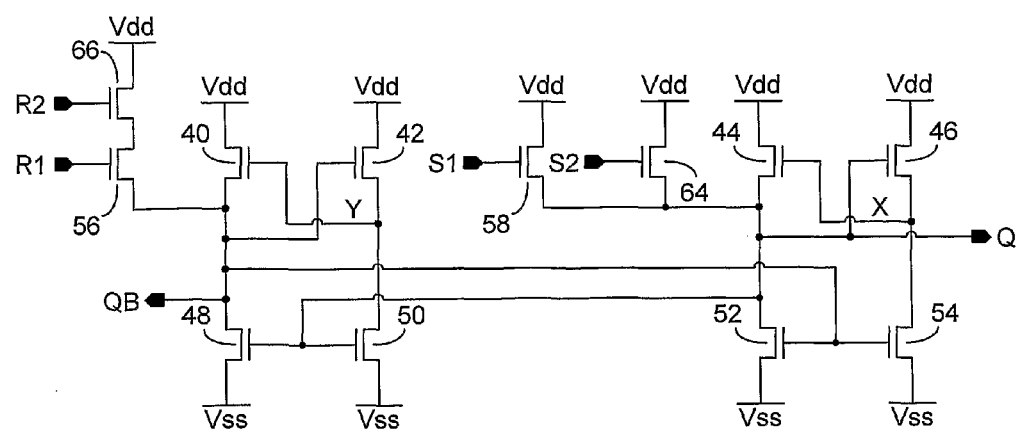
FIG. 13 is a schematic diagram of a latch circuit according to a third embodiment of the invention.

The third embodiment is shown in FIG. 13. The circuit is similar to FIG. 11, and only the differences will be described: the gate of transistor 58 is connected to input S1, and an additional transistor 64 is included such that its source is connected to Vdd, its drain to output Q, and its gate to an additional input S2; the gate of transistor 56 is connected to input R1, and its source to the drain of a second additional transistor 66; the gate of transistor 66 is connected to a further additional input R2, and its source to Vdd.

The circuit operates as previously described, except that the stage may now be set by the logical combination (S1 OR S2), and reset by the logical combination (R1 AND R2).

It will be clear to one skilled in the art that it is possible to incorporate any desired logical combination for setting and resetting the latch using the techniques illustrated above.

In addition, if each R input is connected to a logical complement of each S input, the block functions as a logic gate. For example, the circuit in FIG. 13 may be connected as follows: S1 is connected to a signal IN1, R1 to the complement of IN1, IN1B; S2 is connected to a second signal IN2, R2 to the complement of IN2, IN2B. In this case, the circuit will function as an OR gate, and as a NOR gate: Q=IN1 OR IN2, QB=IN1 NOR IN2.

Similarly, an AND and NAND gate could be formed by connecting the IN signals to the R inputs, and the INB signals to the S inputs. In this case, QB=IN1 AND IN2, Q=IN1 NAND IN2.

It will be clear to one skilled in the art that it is possible to generate any standard logical function by using series and parallel connections of the input transistors, as illustrated above.

Figure 14:
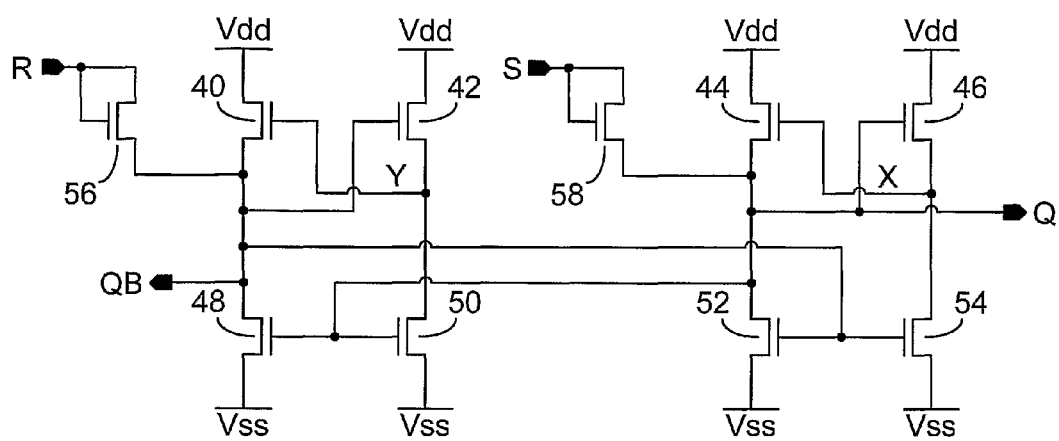
FIG. 14 is a schematic diagram of a latch circuit according to a fourth embodiment of the invention.

The fourth embodiment is shown in FIG. 14. The circuit is similar to FIG. 11, and only the differences will be described: the drain of transistor 56 is connected to the R input, and the drain of transistor 58 is connected to the S input. The operation of the circuit is as previously described: if S is raised to Vdd, it can be seen that the diode connection shown in FIG. 14 is electrically equivalent to the Vdd connection shown in FIG. 11.

Figure 15:
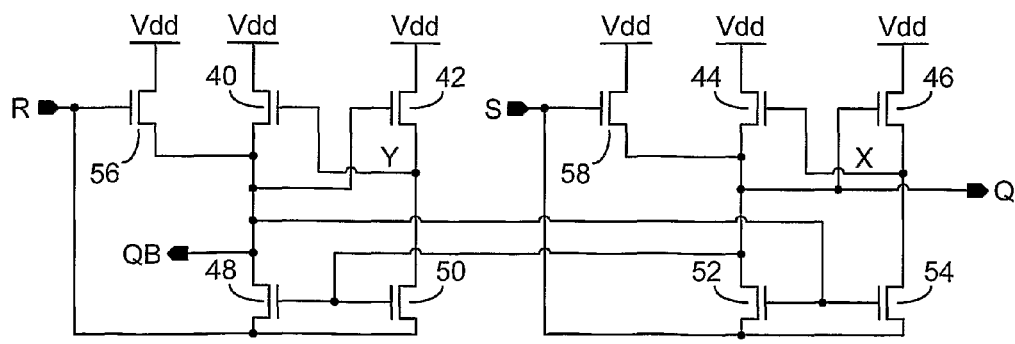
FIG. 15 is a schematic diagram of a latch circuit according to a fifth embodiment of the invention.

The fifth embodiment is shown in FIG. 15. The circuit is similar to FIG. 11, and only the differences will be described: the sources of transistors 48 and 50 are connected to (a "second input" of the circuit connected to) the R input, and the sources of transistors 52 and 54 are connected to (a seventh input" of the circuit connected to) the S input.

The operation of the circuit is similar to that previously described: when S is at a low level, the sources of transistors 52 and 54 are connected to Vss, as before, and both transistors are conducting; when S rises, this rise is conducted onto nodes Q and X, causing both to rise, as before.

Figure 16:
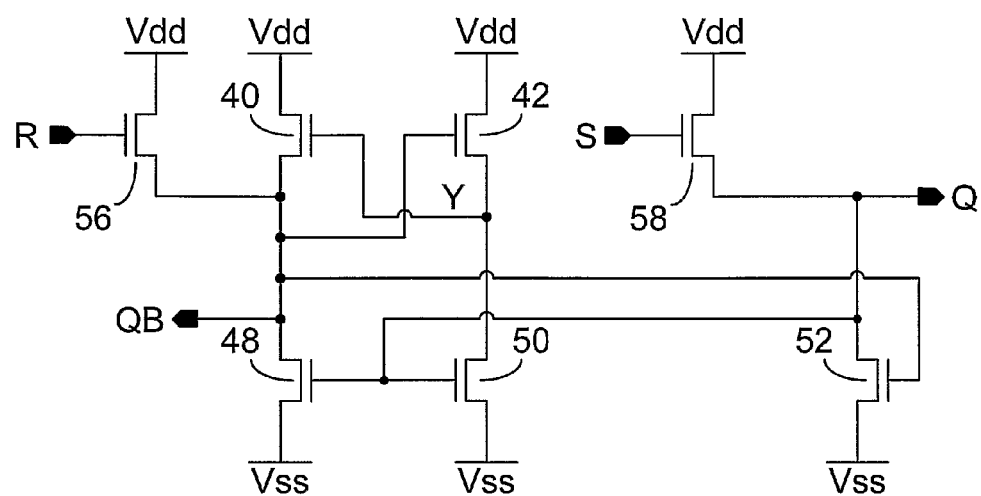
FIG. 16 is a schematic diagram of a latch circuit according to a sixth embodiment of the invention.

The sixth embodiment is shown in FIG. 16. The circuit is similar to FIG. 11, with the omission of transistors 44, 46 and 54. The operation of the circuit is as previously described, with the omission of feedback from node X to Q: when the S input is raised to a high level, the Q output is charged to (Vdd–$V_{TH}$); this turns on transistors 48 and 50, such that nodes QB and Y are discharged; when QB is discharged, transistor 52 is turned off, and the Q node is allowed to float at its current value. The reset operation is as described for the first embodiment.

Figure 17:
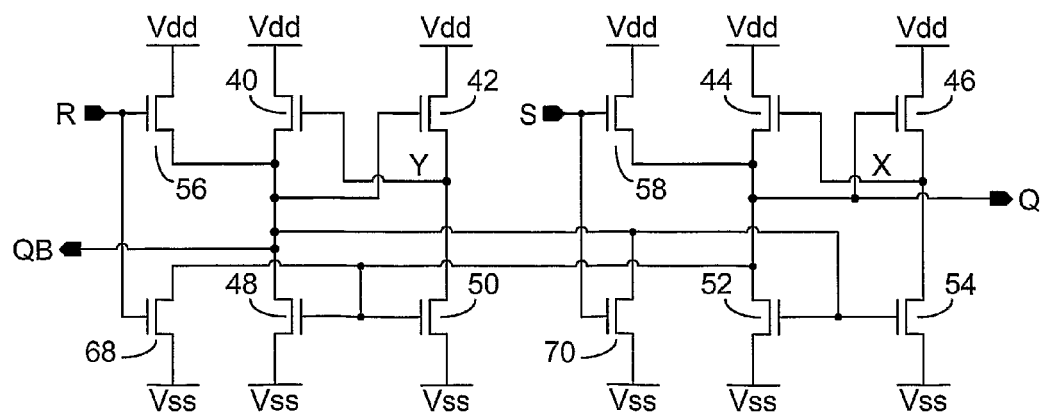
FIG. 17 is a schematic diagram of a latch circuit according to a seventh embodiment of the invention.

The seventh embodiment is shown in FIG. 17. The circuit is similar to FIG. 11, with the addition of transistors 68 and 70: the gates of the transistors are connected to the R and S inputs respectively; the drain of transistor 68 is connected to the Q output; the drain of transistor 70 is connected to the QB output; the sources of both transistors are connected to Vss.

The operation of the circuit is as described for the first embodiment. When the S input is raised to a high level, the QB output is discharged directly via transistor 70, permitting faster switching and reduced short-circuit current during switching. Similarly, transistor 68 discharges the Q output when the R input is raised to a high level.

It will be obvious to one skilled in the art that elements of the above embodiments may be combined to give further circuit architectures.

The eighth embodiment is shown in FIG. 18. The circuit is similar to FIG. 11, and only the differences will be described: the gates of transistors 56 and 58 are connected to a CK input, there is no S or R input; the source of transistor 58 is connected to an IN input; the source of transistor 56 is connected to an INB input.

The operation of the circuit is similar to the first embodiment. However, the circuit operates as a D-type latch if INB is the logical complement of IN: when the CK input is high, Q will be high if IN is high and INB low (similar to the previous set state), and Q will be low if IN is low and INB is high (similar to the reset state); when CK falls, the state of the latch immediately before the falling edge will be held until the next rising edge on CK (similar to the latched state previously, when both the S and R inputs are low).

Figure 19:
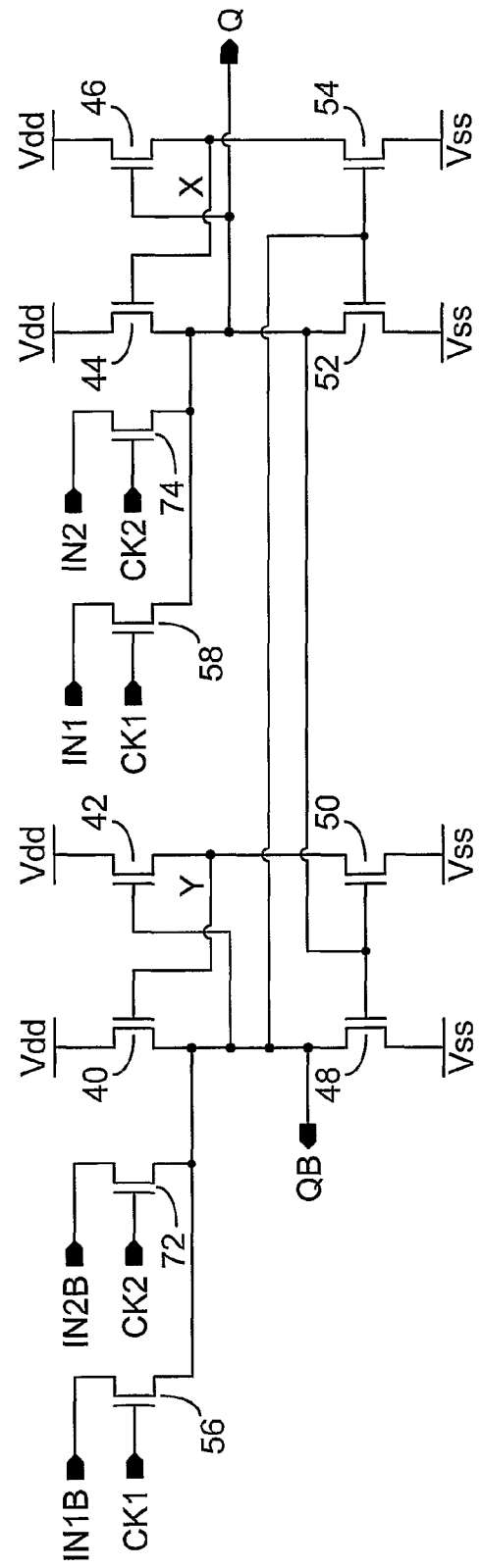
FIG. 19 is a schematic diagram of a latch circuit according to a ninth embodiment of the invention.

The ninth embodiment is shown in FIG. 19. The circuit is similar to FIG. 18, and only the differences will be described: the gate and drain of transistor 58 are connected to a first clock input, CK1, and a first data input IN1 respectively; the gate and drain of transistor 56 are connected to the first clock input, CK1, and a first complementary data input IN1B respectively; a first additional transistor 74 is connected such that its gate, drain and source are connected to a second clock input, CK2, a second data input, IN2, and the Q output respectively; a second additional transistor 72 is connected such that its gate, drain and source are connected to the second clock input, CK2, a second complementary data input, IN2B, and the QB output respectively.

The operation of the circuit is similar to the eighth embodiment. If IN1B and IN2B are logical complements of IN1 and IN2 respectively, the circuit operates as a latch: when the CK1 input is high, Q will be high if IN1 is high and IN1B low, and Q will be low if IN1 is low and IN1B is high; when CK1 falls, the state of the latch immediately before the falling edge will be held until the next rising edge on CK1 or CK2. Similarly, when the CK2 input is high, Q will be high if IN2 is high and IN2B low, and Q will be low if IN2 is low and IN2B is high; when CK2 falls, the state of the latch immediately before the falling edge will be held until the next rising edge on CK1 or CK2.

CK1 and CK2 should not be high simultaneously.

The tenth embodiment is shown in FIG. 20. The circuit is similar to FIG. 18, and only the differences will be described: the drain of transistor 56 is connected to the source of first additional transistor 76, and not to the complementary data input INB; the gates of transistors 56 and 76 are connected to clock inputs CK1 and CK2 respectively; the drain of transistor 76 is connected to the complementary data input, INB; the drain of transistor 58 is connected to the source of second additional transistor 78, and not to the data input IN; the gates of transistors 58 and 78 are connected to clock inputs CK1 and CK2 respectively; the drain of transistor 78 is connected to the data input, IN.

The operation is similar to the eighth embodiment: when the CK1 and CK2 inputs are both high, Q will be high if IN is high and INB low, and Q will be low if IN is low and INB is high; when CK1 or CK2 falls, the state of the latch immediately before the falling edge will be held until the next time CK1 and CK2 are both high.

It will be clear to one skilled in the art that it is possible to incorporate any desired logical combination of clocks for latching data using the techniques illustrated above.

Bootstrap capacitors may be added to the D-latch, as in the second embodiment.

Figure 1:
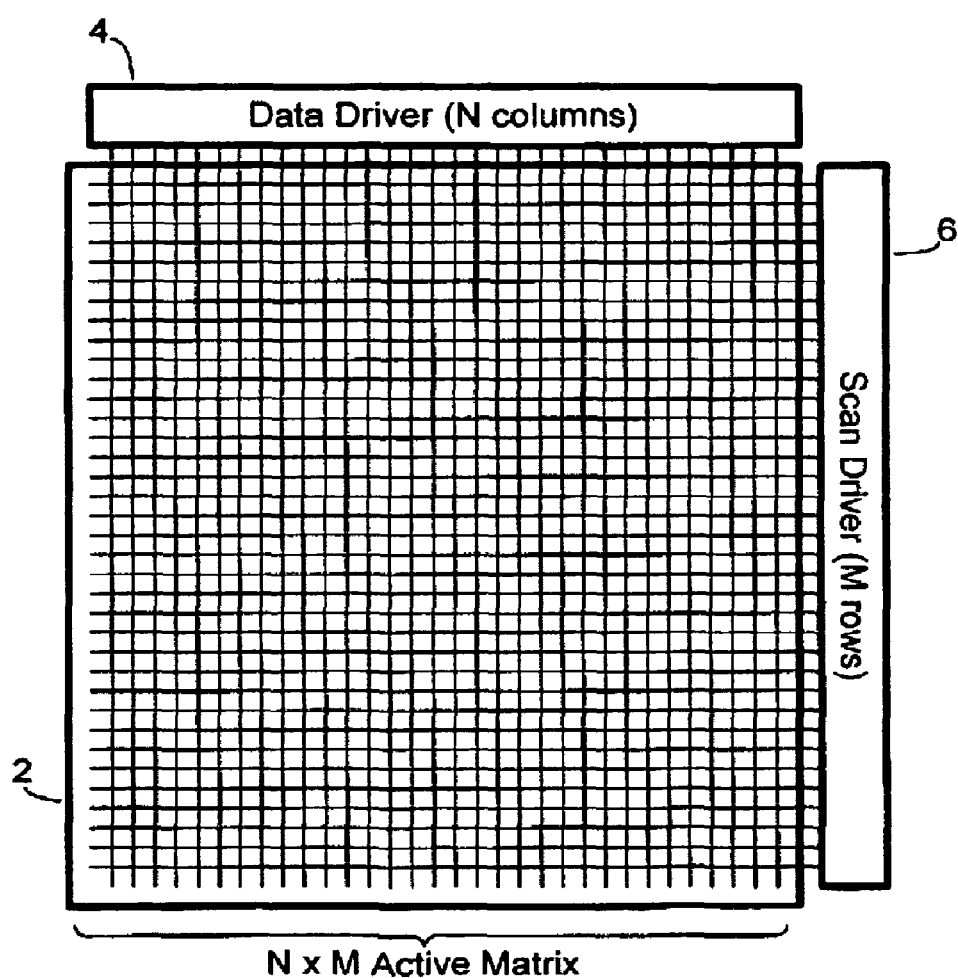
FIG. 1 shows a typical active matrix display.
Figure 2:
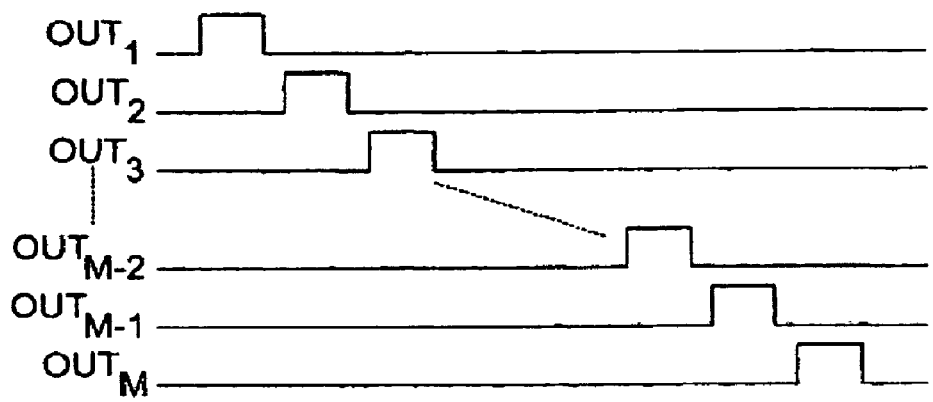
FIG. 2 shows the outputs of a typical scan driver in the normal mode of operation.
Figure 3:
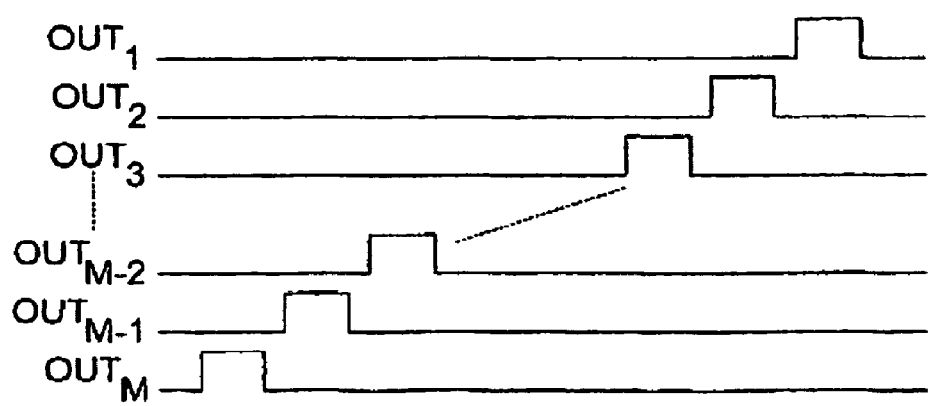
FIG. 3 shows the outputs of a typical scan driver in the reverse mode of operation.
Figure 6:
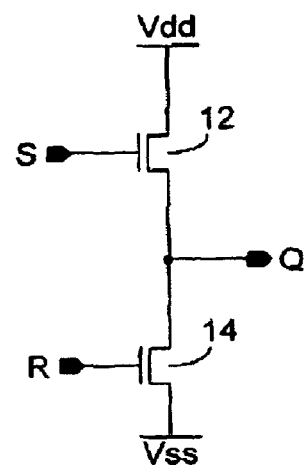
Figure 7:
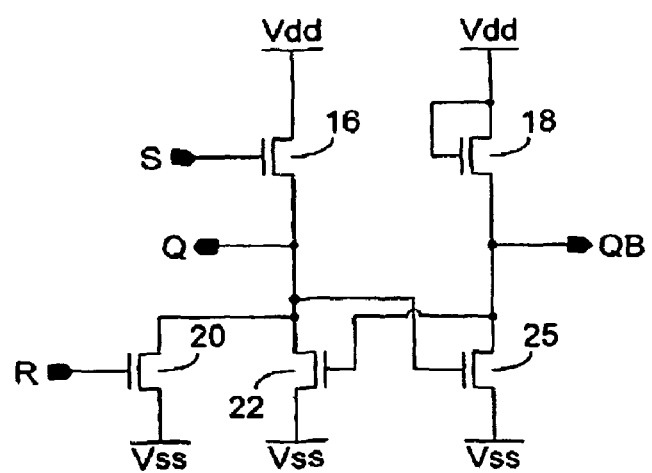
Figure 8:
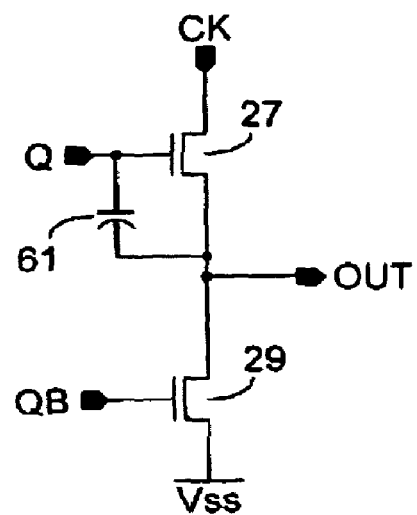
FIG. 8 is a schematic diagram of a prior art nMOS gate circuit with bootstrap capacitor.
Figure 9:
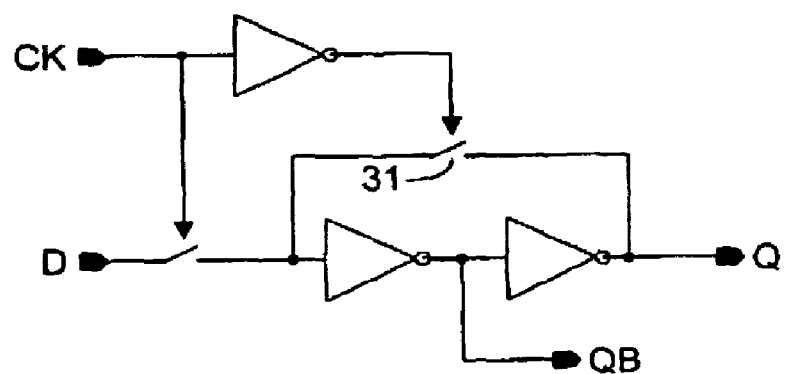
FIGS. 9 and 10 are schematic diagrams of prior art D-type latches.
Figure 10:
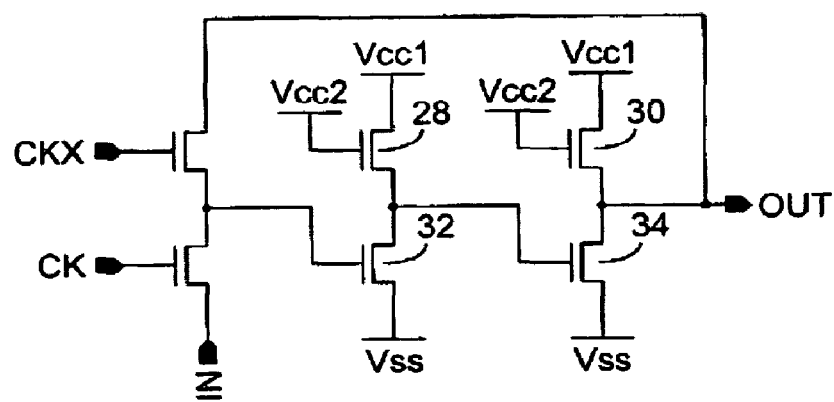

The eleventh embodiment utilises the RS latch in a shift register, as shown in FIG. 4: the RS latch may be embodied as shown in FIG. 11, and the switch as shown in FIG. 8. The shift register may form part of an active matrix device, such as a liquid crystal device, for example as shown in FIG. 1.

Figure 21:
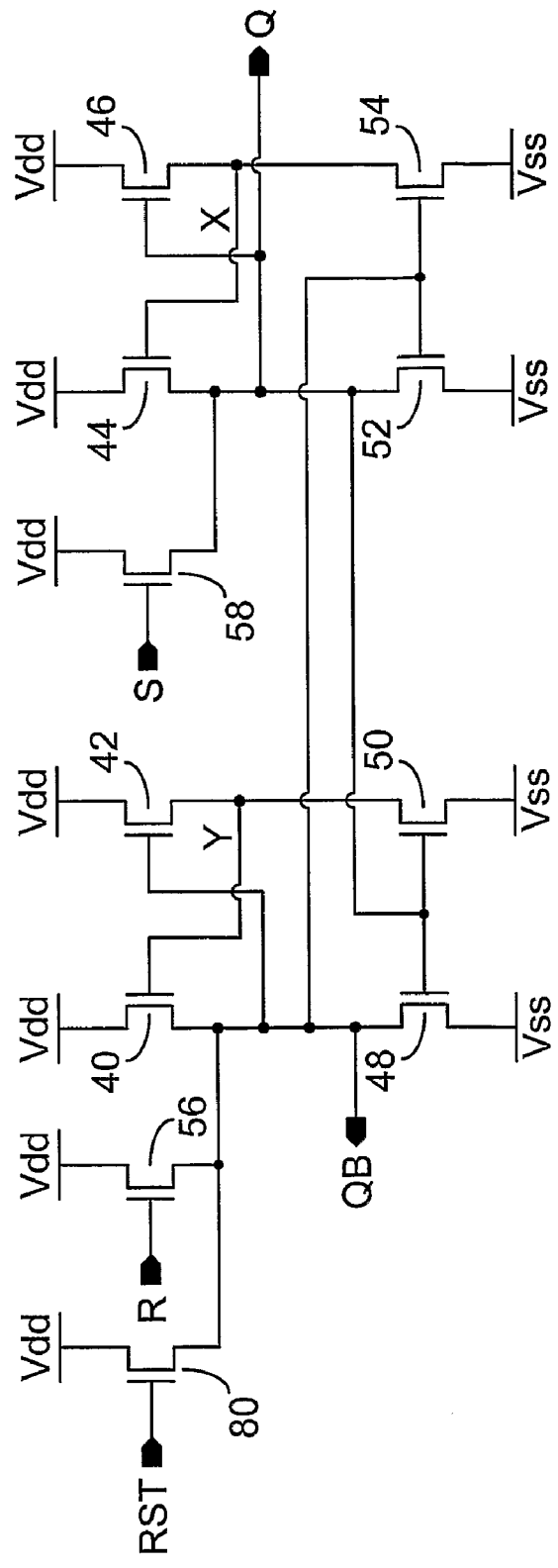
FIG. 21 is a schematic diagram of a latch circuit according to an eleventh embodiment of the invention.

In addition, a global reset may be added to the shift register, as shown in FIG. 21: each stage is as in FIG. 11, with the addition of a reset transistor 80. The gate of transistor 80 is connected to an RST input; the drain is connected to Vdd and the source to the source of transistor 56. The RST inputs of all stages of the register are connected together, and to a global reset signal. This signal may be raised to a high logic level to reset all stages of the register, for example at start-up.

It will be obvious to one skilled in the art that a shift register may also be formed using any of the latches in FIG. 12, 14, 15, 16 or 17 to replace the latch of FIG. 11. In addition, node X may be used to replace Q and/or node Y may be used to replace QB where applicable. A global reset may be added in a similar way to that illustrated in FIG. 21.

Figure 22:
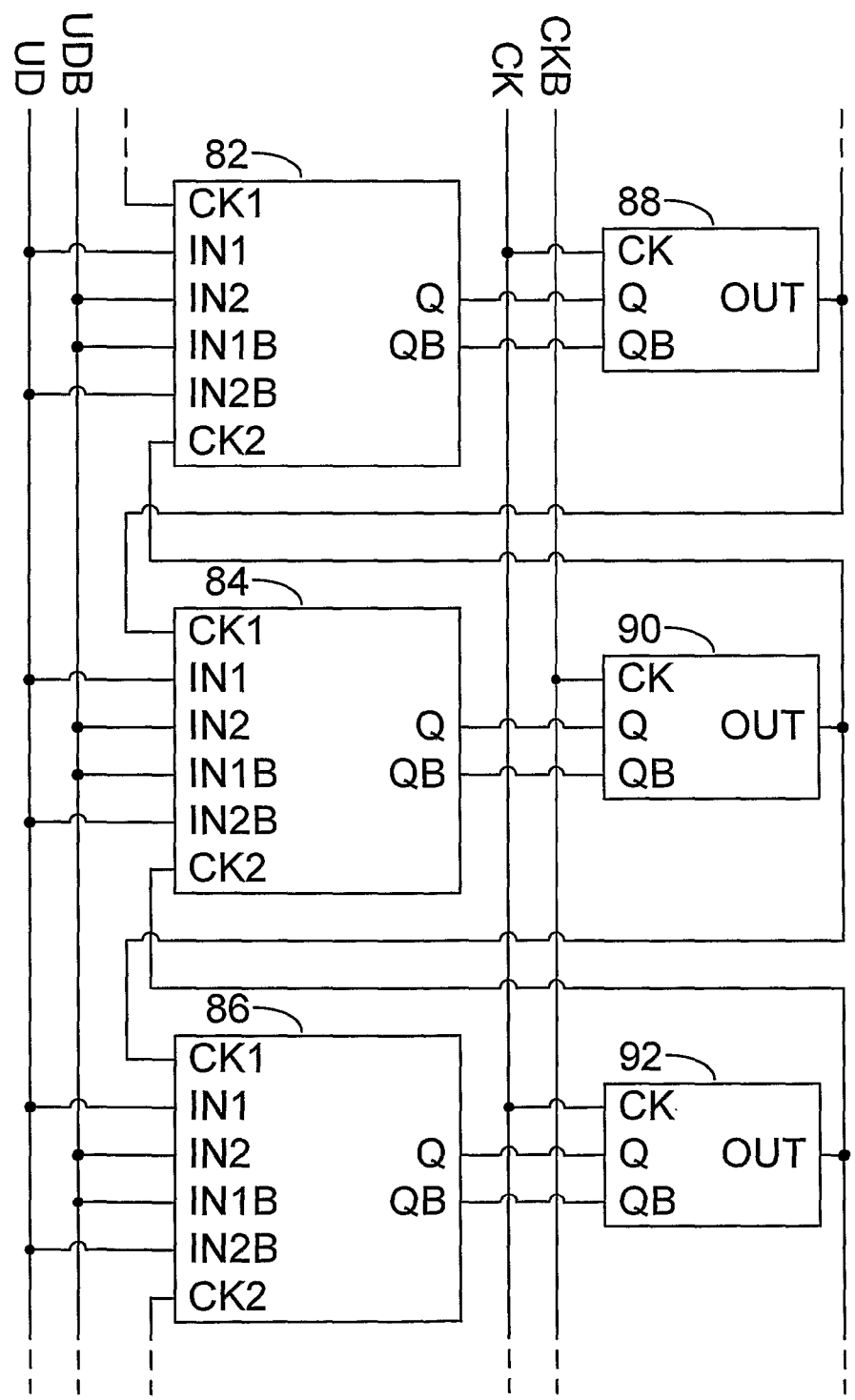
FIG. 22 is a block schematic diagram of a bi-directional clock generator circuit according to a twelfth embodiment of the invention.

The twelfth embodiment utilises the latch in a bi-directional shift register. A three-stage section of a register is shown in FIG. 22. The register is composed of latches 82-86, which may be embodied as shown in FIG. 19, and gates 88-92, which may be embodied as shown in FIG. 8. The IN1 and IN2B inputs of each latch are connected to a first direction signal, UD; the IN1B and IN2 inputs of each latch are connected to a second direction signal, UDB, which may be the logical complement of UD; the Q and QB outputs of each latch 82, 84 and 86 are connected to the Q and QB inputs of each gate 88, 90 and 92 respectively; the OUT output of each gate is connected to the CK1 input of the succeeding latch and the CK2 input of each preceding latch.

The operation of the circuit is similar to the eleventh embodiment. When UD is high, the Q output of latch 84 rises when the OUT output of gate 88 rises, and falls when the OUT output of gate 92 rises; when UD is low, and UDB is high, the Q output of latch 84 rises when the OUT output of gate 92 rises and falls when the OUT output of gate 88 rises. Thus the register pulses scan from top to bottom when UD is high, and from bottom to top when UD is low.

As for the eleventh embodiment, node X may be used to replace Q and/or node Y may be used to replace QB in each latch. A global reset may be added in a similar way to that illustrated in FIG. 21.

As described in the prior art, the shift registers of the eleventh and twelfth embodiments may be used with either complementary or non-overlapping clocks.

GB published patent applications numbers 2452278 and 2452279 describe modifications to the output switch for a shift register of the form of FIG. 4. It will be clear to one skilled in the art that either or both modifications may be applied to the shift registers of the types described.

The above embodiments have been described using n-channel transistors. It will be clear to one skilled in the art that it is possible to implement all the embodiments using only p-channel transistors, with all polarities reversed, such that active-high signals are replaced by active-low signals and connections to Vss and Vdd are replaced by connections to Vdd and Vss, respectively.

The invention claimed is:

1. A digital logic circuit comprising:
   a plurality of transistors of a same conduction type, the plurality of transistors including,
   a first transistor whose source, gate and drain are connected to a first circuit node, a second circuit node and a first power supply line, respectively;
   a second transistor whose source, gate and drain are connected to the second circuit node, the first circuit node and the first power supply line, respectively;
   a third transistor whose drain is connected to the first circuit node;
   a fourth transistor whose gate and drain are connected to a third circuit node and the second circuit node, respectively; and
   a fifth transistor whose gate is connected to the first or second circuit node and whose drain is connected to the third circuit node.

2. The digital logic circuit as claimed in claim 1, in which a gate of the third transistor is connected to the third circuit node.

3. The digital logic circuit as claimed in claim 1, comprising a first bootstrap capacitor connected between the first and second circuit nodes.

4. The digital logic circuit as claimed in claim 1, in which one of the first and second circuit nodes includes a first output of the digital logic circuit.

5. The digital logic circuit as claimed in claim 1, in which the first circuit node includes a first output node of the digital logic circuit.

6. The digital logic circuit as claimed in claim 1, in which the plurality of transistors include a sixth transistor whose source and gate are connected to the first circuit node and a first input of the digital logic circuit, respectively.

7. The digital logic circuit as claimed in claim 6, in which the sources of the third and fourth transistors are connected to the first input.

8. The digital logic circuit as claimed in claim 1, in which the sources of the third and fourth transistors are connected to a first input of the digital logic circuit.

9. The digital logic circuit as claimed in claim 1, in which sources of the third and fourth transistors are connected to a second power supply line.

10. The digital logic circuit as claimed in claim 6, in which a drain of the sixth transistor is connected to the first power supply line.

11. The digital logic circuit as claimed in claim 6, in which a drain of the sixth transistor is connected to the first input.

12. The digital logic circuit as claimed in claim 6, in which a drain of the sixth transistor is connected to a second input of the digital logic circuit.

13. The digital logic circuit as claimed in claim 6, in which the plurality of transistors comprises a seventh transistor whose source and gate are connected to a drain of the sixth transistor and a second input of the digital logic circuit, respectively.

14. The digital logic circuit as claimed in claim 6, in which the plurality of transistors comprises a seventh transistor whose source and gate are connected to the first node and a second input of the digital logic circuit, respectively.

15. The digital logic circuit as claimed in claim 14, in which the second input comprises a global reset input.

16. The digital logic circuit as claimed in claim 6, in which the plurality of transistors comprises a seventh transistor whose gate and drain are connected to the first input and the third circuit node, respectively.

17. The digital logic circuit as claimed in claim 6, in which the plurality of transistors includes a seventh transistor whose source, gate and drain are connected to the third circuit node, a second input of the digital logic circuit, and the first power supply line, respectively.

18. The digital logic circuit as claimed in claim 6, in which the plurality of transistors include,
   a seventh transistor whose source, gate and drain are connected to the third circuit node, a fourth circuit node, and the first power supply line, respectively;
   an eighth transistor whose source, gate and drain are connected to the fourth circuit node, the third circuit node, and the first power supply line, respectively; and
   a ninth transistor whose drain is connected to the fourth circuit node.

19. The digital logic circuit as claimed in claim 18, in which a gate of the ninth transistor is connected to the first or second circuit node.

20. The digital logic circuit as claimed in claim 18, comprising a bootstrap capacitor connected between the third and fourth circuit nodes.

21. The digital logic circuit as claimed in claim 18, in which one of the third and fourth circuit nodes includes a second output of the digital logic circuit.

22. The digital logic circuit as claimed in claim 18, in which the third circuit node includes a second output node of the digital logic circuit.

23. The digital logic circuit as claimed in claim 16, in which the plurality of transistors comprises an eighth transistor whose source and gate are connected to the third circuit node and a second input of the digital logic circuit, respectively.

24. The digital logic circuit as claimed in claim 18, in which the sources of the fifth and ninth transistors are connected to a second input of the digital logic circuit.

25. The digital logic circuit as claimed in claim 18, in which sources of the fifth and ninth transistors are connected to a second power supply line.

26. The digital logic circuit as claimed in claim 18, in which the plurality of transistors comprises a tenth transistor whose source and gate are connected to the third circuit node and a second input of the digital logic circuit, respectively.

27. The digital logic circuit as claimed in claim 26, in which the drain of the tenth transistor is connected to the second input.

28. The digital logic circuit as claimed in claim 26, in which the drain of the tenth transistor is connected to a third input of the digital logic circuit.

29. The digital logic circuit as claimed in claim 26, in which the plurality of transistors comprises an eleventh transistor whose source and gate are connected to the drain of the tenth transistor and a third input of the digital logic circuit, respectively.

30. The digital logic circuit as claimed in claim 26, in which the plurality of transistors comprises an eleventh transistor whose source and gate are connected to the third circuit node and a third input of the digital logic circuit, respectively.

31. The digital logic circuit as claimed in claim 26, in which the plurality of transistors comprises an eleventh transistor whose gate and drain are connected to the second input and the first circuit node, respectively.

32. The digital logic circuit as claimed in claim 1, comprising a latch or flip flop.

33. A shift register comprising a plurality of latches or flip flops as claimed in claim 32.

34. An active matrix device comprising a register as claimed in claim 33.

35. A device as claimed in claim 34, comprising a liquid crystal device.

36. The digital logic circuit as claimed in claim 17, in which the plurality of transistors comprises an eighth transistor whose source and gate are connected to the third circuit node and a third input of the digital logic circuit, respectively.

37. The digital logic circuit as claimed in claim 26, in which the drain of the tenth transistor is connected to the first supply line.

38. The digital logic circuit as claimed in claim 36, in which the sources of the fifth and seventh transistors are connected to the second power supply line.

39. The digital logic circuit as claimed in claim 26, in which the sources of the fifth and nine transistors are connected to the second input.

* * * * *